United States Patent
Tsai et al.

(10) Patent No.: US 8,437,870 B2
(45) Date of Patent: May 7, 2013

(54) SYSTEM AND METHOD FOR IMPLEMENTING A VIRTUAL METROLOGY ADVANCED PROCESS CONTROL PLATFORM

(75) Inventors: Po-Feng Tsai, Taipei (TW); Andy Tsen, Chung-Ho (TW); Jin-Ning Sung, Pingjhen (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 519 days.

(21) Appl. No.: 12/478,956

(22) Filed: Jun. 5, 2009

(65) Prior Publication Data

US 2010/0312374 A1 Dec. 9, 2010

(51) Int. Cl.
*G06F 17/50* (2006.01)

(52) U.S. Cl.
USPC ........... 700/110; 700/121; 700/109; 700/108; 700/28; 700/104; 700/103; 700/105; 702/84; 703/2; 703/14

(58) Field of Classification Search .................... 700/110
See application file for complete search history.

(56) References Cited

U.S. PATENT DOCUMENTS

| | | | | |
|---|---|---|---|---|
| 5,408,405 A | * | 4/1995 | Mozumder et al. | 700/31 |
| 6,589,800 B2 | * | 7/2003 | Patel et al. | 438/14 |
| 7,359,759 B2 | | 4/2008 | Cheng et al. | |
| 7,477,960 B2 | | 1/2009 | Willis et al. | |
| 7,869,894 B2 | * | 1/2011 | Stirton et al. | 700/109 |
| 8,108,060 B2 | * | 1/2012 | Tsen et al. | 700/108 |
| 8,271,103 B2 | * | 9/2012 | Hendler et al. | 700/31 |
| 2004/0159397 A1 | * | 8/2004 | Bode et al. | 156/345.5 |
| 2005/0192698 A1 | | 9/2005 | Cheng et al. | |
| 2005/0288812 A1 | * | 12/2005 | Cheng et al. | 700/109 |
| 2006/0129257 A1 | * | 6/2006 | Chen et al. | 700/96 |
| 2006/0235560 A1 | * | 10/2006 | Ogawa et al. | 700/109 |
| 2006/0252348 A1 | * | 11/2006 | Lin et al. | 451/5 |
| 2006/0259279 A1 | * | 11/2006 | Ayala et al. | 702/187 |
| 2007/0078556 A1 | * | 4/2007 | Stirton et al. | 700/108 |
| 2007/0282767 A1 | * | 12/2007 | Cheng et al. | 706/15 |
| 2008/0233662 A1 | * | 9/2008 | Shen et al. | 438/8 |

(Continued)

OTHER PUBLICATIONS

Moyne et al, U.S. Appl. No. 61/068,652, filed Mar. 6, 2008, pp. 4-9, 33-36.*

(Continued)

*Primary Examiner* — Jeffrey A. Gaffin
*Assistant Examiner* — Olvin Lopez Alvarez
(74) *Attorney, Agent, or Firm* — Haynes and Boone, LLP

(57) ABSTRACT

System and method for implementing a VM APC platform are described. In one embodiment, the VM APC system comprises a process tool for processing a plurality of wafers, a metrology tool for measuring a sample wafer of the plurality of wafers and generating actual metrology data therefor, and a VM model for predicting metrology data for each of the plurality of wafers. The actual metrology data is received from the metrology tool and used to update the VM model. Key variables of the virtual metrology model are updated only in response to a determination that the VM model is inaccurate and parameters of the VM model are updated responsive to receipt of the actual metrology data for the sample wafer of the plurality of wafers. The system also includes an APC controller for receiving the predicted metrology data and the actual metrology data and controlling an operation of the process tool based on the received data.

17 Claims, 4 Drawing Sheets

Online implementation with W2W control

Notations:
n = wafer number
k = lot number
t = time

U.S. PATENT DOCUMENTS

2009/0099991 A1* 4/2009 Lam et al. .................. 706/46
2009/0192743 A1* 7/2009 Ikeda et al. ................. 702/83
2009/0228129 A1* 9/2009 Moyne et al. ............... 700/102
2010/0305737 A1* 12/2010 Good et al. ................. 700/105

OTHER PUBLICATIONS

Kang et al, "A virtual metrology system for semiconductor manufacturing", May 23, 2009, Elsevier, pp. 12554-12561.*

Hung et al, A novel Virtual Metrology Scheme for Predicting CVD Thickness in Semiconductor Manufacturing, Jun. 2007, IEEE/ASME transactions on Mechatronics, vol. 2 No. 3, pp. 308-316.*

Butler et al, "Supervisory Run-to-Run Control of Polysilicon Gate Etch Using In Situ Ellipsometry", 1994, IEEE, pp. 193-201.*

Khan et al, "Virtual metrology and feedback control for semiconductor manufacturing processes using recursive partial least squares", 2008, Elsevier, pp. 961-974.*

"6.32.4. EWMA Control Charts", Engineering Statistics Handbook, Feb. 18, 2009, 4 pages. http://www.itl.nist.gov/div898/handbook/pmc/section3/pmc324.htm.

David Harper, CFA, FRM, "Exploring the Exponentially Weighted Moving Average", Feb. 18, 2009 Investopedia.com, 4 pages. http://investopedia.com/printable.asp?a=/articles/07/WEMA.asp.

Alan Weber, "Virtual Metrology and Your Technology Watch List: Ten Things You Should Know About This Emerging Technology", Future Fab Intl., Jan. 30, 2009, 6 pages. http:www.future-fab.com/login.asp?s_id=&d_ID=4218&mode=print.

* cited by examiner

SYSTEM AND METHOD FOR IMPLEMENTING A VIRTUAL METROLOGY ADVANCED PROCESS CONTROL PLATFORM

BACKGROUND

The present disclosure relates generally to Advanced Process Control ("APC") as applied to semiconductor fabrication and, more particularly, to system and method for implementing a Virtual Metrology ("VM") APC platform.

APC has become an essential component in semiconductor fabrication for enabling continued improvement of device yield and reliability at a reduced cost. Significant elements of APC include integrated metrology, fault detection and classification, and run-to-run ("R2R") control. APC aids in reducing process variation as well as production costs. A key requirement for effective APC is that metrology tools must be available to measure key parameters within an acceptable time frame. Additionally, methods must be provided for analyzing and interpreting measurement data produced by the metrology tools. In practice, APC requires rich in-line measurements because the manufacturing processes are usually subjected to disturbance and drift. In the past, one of the primary limitations on APC at the wafer-to-wafer ("W2W") level has been the nonavailability of timely metrology data at that level. VM techniques have alleviated this problem to some degree.

The basic theory of operation for VM is that, in a development flow, a range of production runs is used to develop an empirical prediction model that correlates to actual measurements from metrology tools with the process trace data that was present at the time. The model is refined until the metrology values it predicts show a reasonable correlation to the actual measurement data. Once the model is developed, the VM system goes "live," or "online," in the production flow and is used during execution of a process runs to estimate metrology values for wafers being processed. Variations from the desired targets are used to update recipe parameters in a traditional R2R control fashion. These updates, or adjustments, can be made on a W2W basis without requiring a separate measurement step to be performed. It will be recognized that actual metrology measurements are still made in the production flow; however, their role is primarily that of calibrating/updating the prediction model, rather than as the primary control checkpoint for the process.

SUMMARY

One embodiment is a VM APC system comprising a process tool for processing a plurality of wafers, a metrology tool for measuring a sample wafer of the plurality of wafers and generating actual metrology data therefor, and a VM model for predicting metrology data for each of the plurality of wafers. The actual metrology data is received from the metrology tool and used to update the VM model. Key variables of the virtual metrology model are updated only in response to a determination that the VM model is inaccurate and parameters of the VM model are updated responsive to receipt of the actual metrology data for the sample wafer of the plurality of wafers. The system also includes an APC controller for receiving the predicted metrology data and the actual metrology data and controlling an operation of the process tool based on the received data.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to APC as applied to semiconductor fabrication and, more particularly, to system and method for implementing a VM APC platform. It is understood, however, that specific embodiments are provided as examples to teach the broader inventive concept, and one of ordinary skill in the art can easily apply the teachings of the present disclosure to other methods and systems. Also, it is understood that the methods and systems discussed in the present disclosure include some conventional structures and/or steps. Since these structures and steps are well known in the art, they will only be discussed in a general level of detail. Furthermore, reference numbers are repeated throughout the drawings for the sake of convenience and example, and such repetition does not indicate any required combination of features or steps throughout the drawings.

Figure 1A:
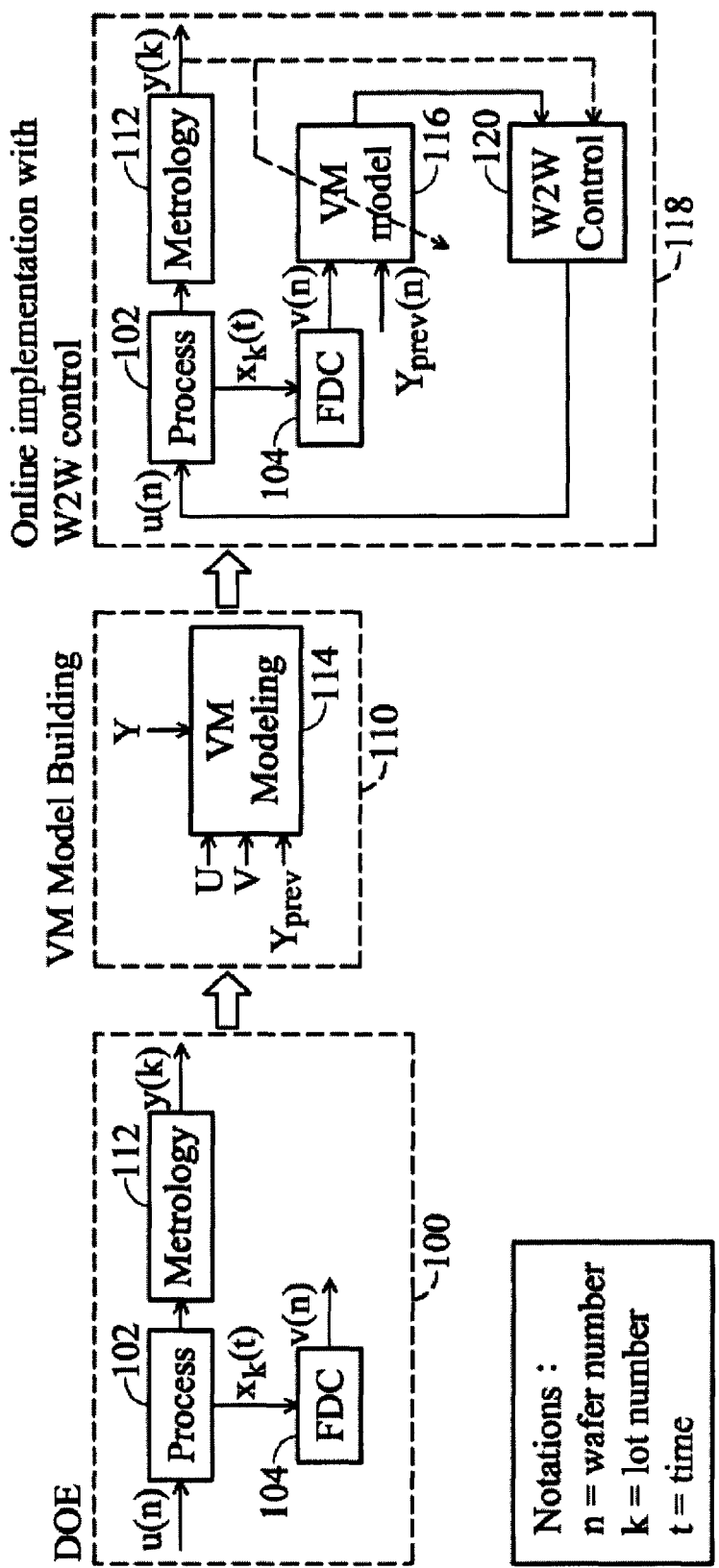
FIG. 1A illustrates application of VM principles to an individual manufacturing process in accordance with the prior art.

FIG. 1A illustrates VM principles as applied to an individual process in accordance with the prior art. A module 100 illustrates construction of a process model via a design of experiments ("DOE") process. As will be recognized by those of ordinary skill in the art, DOE is a structured, organized method for determining a relationship between factors affecting a process (x) and the output of that process (y). As illustrated in FIG. 1A in connection with the module 100, for each process run, a process tool 102 is used to process the wafers comprising the run in accordance with process inputs, or recipe settings, u(n). In one embodiment, the process tool 102 may be any one of, for example, an etch tool, a deposition tool, a CMP tool, a coating tool, a developing tool, or a thermal treatment tool. As each of the wafers of the run is processed, quality variables, xk(t) are provided to a Fault Detection and Classification ("FDC") module 104. As will be recognized by one of ordinary skill in the art, the FDC module 104 monitors and analyzes variations in tool and/or process data to detect anomalies and determine the cause of a fault. This data is then stored in a database of the FDC module 104. In one embodiment, process output data is acquired by the FDC module 104 once every second, although it is understood that different sampling rates may be used. The FDC data v(n), or V, out put from the FDC module 104 is applied to a VM Model Building module 110 for purposes that will be described below. For each process run, one or more quality control ("QC") sample wafers are measured after processing by one or more metrology tools, such as a metrology tool 112. The metrology tool generates measurement data y(k), or Y. This measurement data is also applied to the VM model building module 110 for purposes that will be described in greater detail below.

Once the DOE has been completed, process inputs U, FDC data V, and historical and current measurement data $Y_{prev}$ and Y are input to a VM modeling module 114, of the module 110, which uses the inputs thereto to construct a VM model 116 in a conventional manner The VM model 116 is applied in a system 118 comprising online implementation of VM with wafer-to-wafer ("W2W") control. In the system 118, the VM model 116 is used during execution of a process run to estimate metrology values for the wafers being processed and variations from the desired targets are used to update recipe parameters in traditional R2R control fashion. However, using VM, such adjustments can be made on a W2W basis by a W2W APC controller 120 without requiring a separate measurement step to be performed either internally or externally to the process tool 102. It will be noted that while actual metrology measurements are still made, these measurements are used to calibrate and update the VM model 116, rather than serving as the primary control checkpoint for the system 118.

Figure 1B:
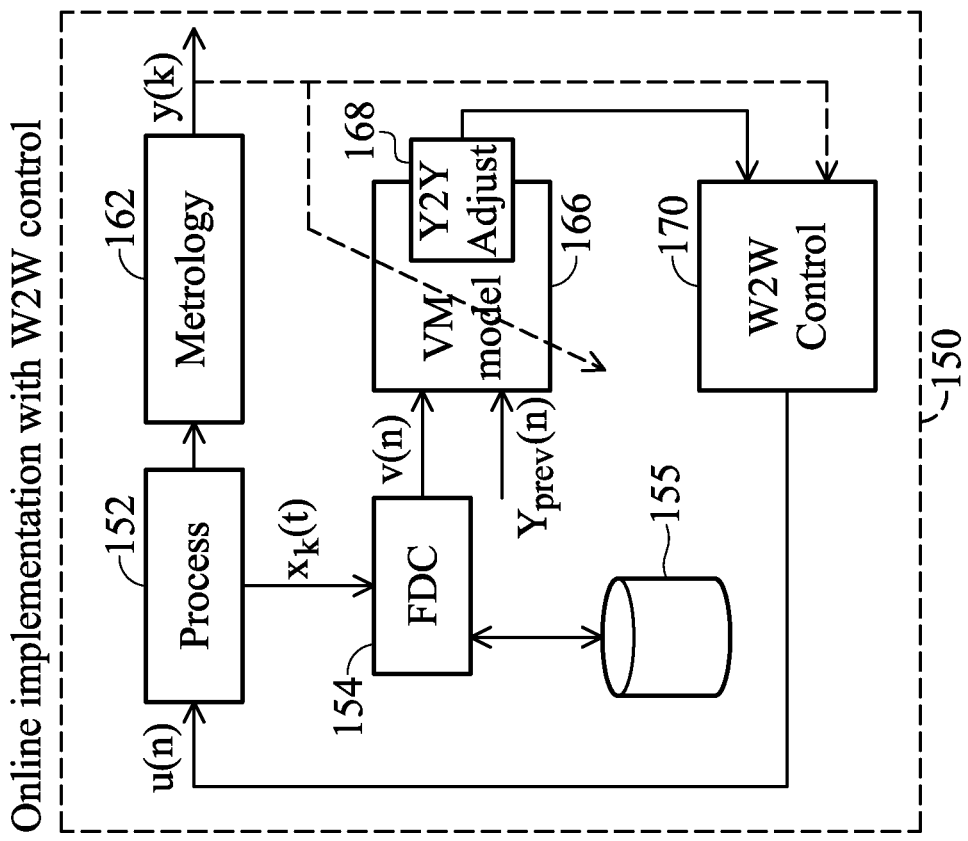
FIG. 1B illustrates application of VM principles to an individual manufacturing process in accordance one embodiment.

FIG. 1B illustrates a system 150 comprising online implementation of VM with wafer-to-wafer ("W2W") control in accordance with embodiments described herein. The system 150 is similar in many respects to the system 118 of FIG. 1A, in that the system 150 includes a process tool 152 for processing wafers as described with respect to process tool 102 (FIG. 1A), quality variables from which are provided to an FDC module 154, which monitors and analyzes variations in tool and/or process data to detect anomalies and determine the cause(s) of a fault and stores data in a database 155 therein. As previously noted, for the purposes of example, it will be assumed that process output data from the process tool 152 is acquired by the FDC module 154 once every second, although it is understood that different sampling rates may be used. As also described above, for each process run, or lot, one or more quality control ("QC") sample wafers are measured after processing by one or more metrology tools, such as a metrology tool 162, which generates measurement data y(k), or Y. As previously noted, the metrology data is applied used to calibrate and update a VM model 166, which is used during execution of a process run to estimate metrology values for the wafers being processed and variations from the desired targets are used to update recipe parameters in traditional R2R control fashion. In accordance with features of the embodiments described herein, the VM model 166 is unique from the VM model 116 in several respects, including the fact that it includes a Y2Y ("measurement data-to-measurement data") adjustment unit 168 for purposes that will be described in detail below. The adjusted prediction data output from the VM model 166 is applied to a W2W APC controller 170, which adjusts the operation of the process tool in accordance with the data.

Figure 2:
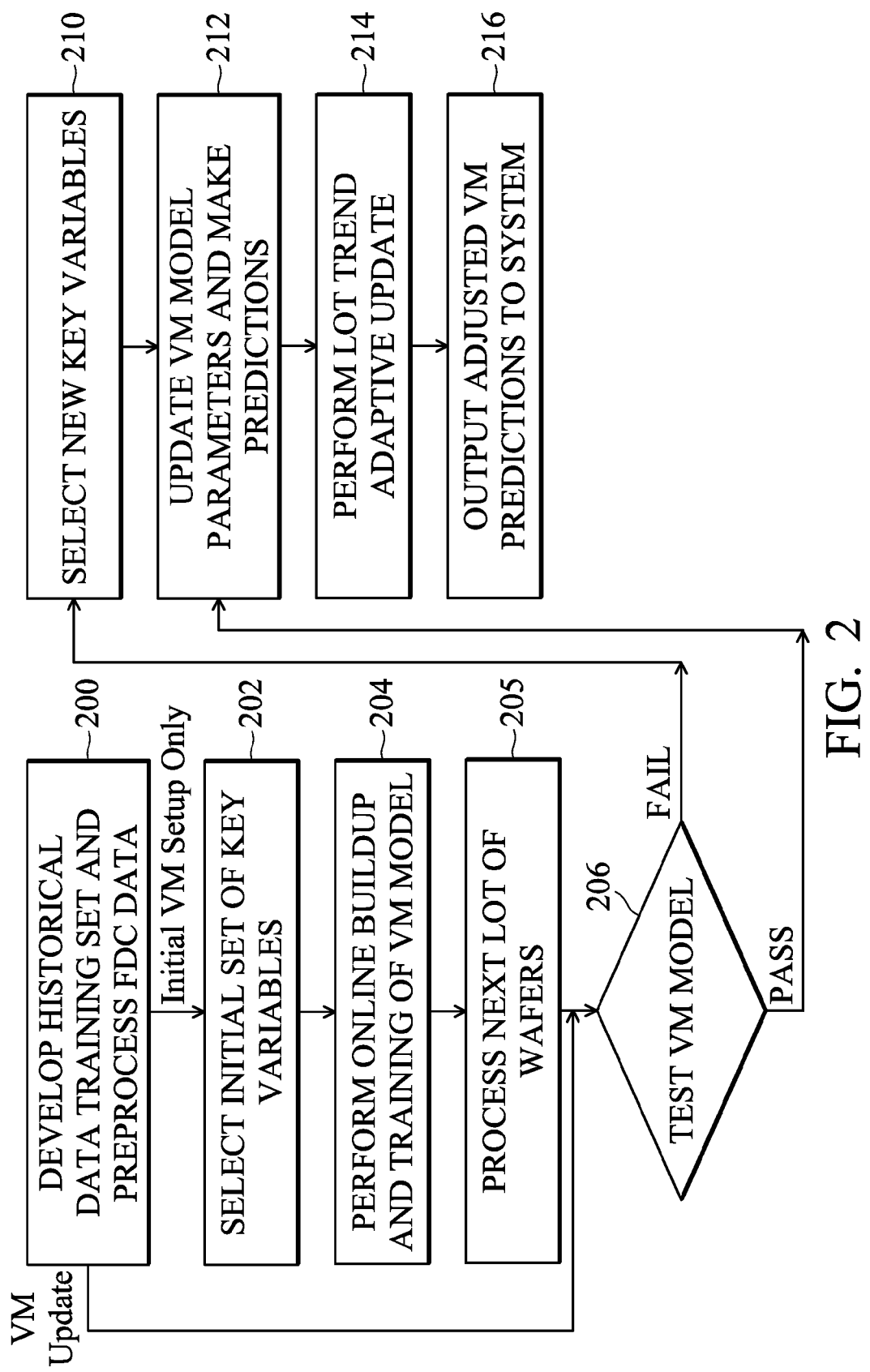
FIG. 2 illustrates a flow diagram of a method for implementing a VM APC platform in accordance with one embodiment.

Referring now to FIG. 2, illustrated therein is a method for implementing a VM APC platform in accordance with one embodiment. In accordance with one preferred embodiment, and as will be described in greater detail below, in one aspect, key variables of a VM model, such as the VM model 166, are updated less frequently than parameters of the model. As used herein, "key variables" refers to important VM model inputs extracted and selected from various sources, such as an FDC, an APC, or an SPC. In contrast, "parameters" refers to weights, constants, or any other tuning variables used in a VM modeling algorithm. In particular, assuming for the sake of example that a VM model may be represented as follows:

$$Y = C_1 X_1 + C_2 X_2 + \ldots C_n X_n$$

key variables of the VM model ($X_1$-$X_n$) are updated on an "as-needed" basis, as will be described, whereas the model parameters ($C_1$-$C_n$) are updated on an L2L basis as new metrology data becomes available. In step 200, a moving window is applied to historical data records, comprising measured input and output data of QC sample wafers measured over time, to develop a historical training data set for building and training the VM model 166. For example, in one embodiment, the historical training data set comprises data records for the most recent 60 wafers. It will be assumed for the sake of example herein that each lot comprises 25 wafers and that for each lot, two wafers are sampled by a metrology tool, such as the tool 162. After each lot is sampled and metrology data for the two QC sample wafers is made available, the historical training data set is updated to include the two new records and to discard the two oldest records. Additionally in step 200, FDC data may be preprocessed. If this is the initial setup of the VM model 166, execution proceeds to step 202, in which an initial set of key variables, such as, for example, temperature and process time, is selected using the historical data training set developed in step 200. The selection of key variables is generally performed by an engineer or technician familiar with the process being monitored.

Additionally in step 200, FDC data may be preprocessed. In accordance with one embodiment, preprocessing of FDC data is accomplished using a time-averaging-based technique to process the time-series FDC data. For example, assuming there are 10 variables reported by the process tool to the FDC ("SVIDs") and recorded each second and further assuming that the process executes for three minutes, there will exist 180 records for each of the SVIDs for a total of 1800 records for a single wafer. As these records are typically treated as 1800 variables, so that a data matrix can be formed with each row representing a different wafer and each column representing a different variables, without some sort of preprocessing, there will be 1800 input candidates for key variable selection. This can result in two problems. First, 1800 candidates it too large to perform stepwise regression described below for selecting key variables due to the large amount of time it would take to run such a process on that many candidates. Second, every single "variable" is actually just a second-based record of an SVID. The resolution of the data is too high, resulting in low system information and high noise susceptibility; therefore, it is physically not suitable for model input. The data may be prepossessed in two ways. First, given a fixed averaging time, for example, 10 seconds, the data is averaged into a 10-second based manner to piecewise the time series data. For each SVID, 180/10 (seconds) is equal to 18, so there will be 180 pieces of data (18*10 SVIDs) per wafer. Second, given a fixed step-piece number, such as 3, each step is divided into three pieces equally. So if a recipe contains 10 steps, 10*3=30 pieces for each SVID and 30*3=20 pieces of data per wafer. The "pieces" are treated as variables for key variable selection. It will be recognized that this preprocessing can be performed either in the FDC module 154 or in the VM model 166.

In step 202, an initial set of key variables, such as, for example, temperature and process time, is selected using the historical data training set developed in step 200. The selection of key variables is generally performed by an engineer or technician familiar with the process being monitored.

In step 204, on-line build-up and training of the VM model 166 is performed using the historical training data set developed in step 200 and the key variables determined in step 202. Any one of a number of well-known methods may be used for performing the build-up and training of the VM model 166 in step 204; therefore, the process will not be described in further detail. In step 205, the VM model 166 is used in processing a next lot of wafers.

After step 205 if this is the initial setup of the VM model 166, or immediately after step 200 if this is not the initial setup of the VM model, execution proceeds to step 206. In step 206, the VM model 166 is tested for accuracy. This is generally accomplished by performing a statistical test, such as a Z-test or T-test, on the VM model, on the 20 and 60 most recent wafers. In particular, because the most recent 20 wafers are used to update the parameters, there must be some means for ensuring that they are consistent with the 60 wafers that are used to select key input variables. In particular, the statistical test is used to determine whether any meaningful change has occurred to the system or tool. If so, the VM must reselect its inputs to ensure that it remains faithful to the system. If the model 166 fails to pass the test, the model is determined to be inaccurate and execution proceeds to step 210. In step 210, new key variables are selected for the VM model using the 60 historical data points. In one embodiment, the step 210 may be performed using stepwise regression to select the new key variables. Execution then proceeds to step 212. If in step 206, the VM model passes the test and is determined to be accurate, execution proceeds directly to step 212.

In step 212, the parameters of the VM model parameters 166 are updated using the most recent historical data points. As various methods for performing step 212 will be recognized by those of ordinary skill in the art, particular methods of updating the VM model parameters in accordance with the embodiments described herein will not be further described. It will be noted that, in the embodiment described herein, VM model parameters are updated with a higher frequency (e.g., on a per-lot basis) than key variables of the VM model, thereby ensuring that the model is synchronized with the system 150 at all times. In contrast, key variables are updated less frequently (e.g., on an as-needed basis), as key variables represent characteristics of the process that by their nature do not change frequently. Lower key variable update frequency results lower computation loadings for online considerations.

Figure 3:
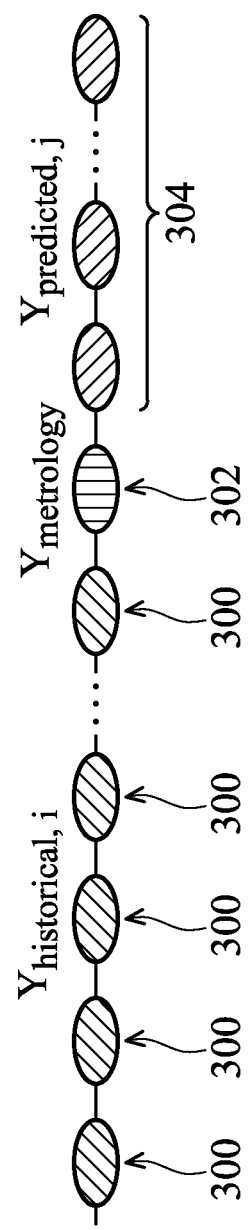
FIG. 3 illustrates a process for performing a lot trend adaptive update in accordance with one embodiment.

In step 214, a lot trend adaptive update, or Y2Y update, of the VM model predictions is performed for each of the wafers of the current lot. In particular, as noted above, the VM model 166 includes a Y2Y adjustment unit 168 which adjusts the prediction values $Y_{predicted, j}$, output by the VM model for each of the j non-sampled wafers of the current lot using i historical output measurements ($Y_{historical, i}$) in a weighted manner. The Y2Y adjustment unit 168 adjusts the predictions made by the VM model 166 using historical measurements of Y to capture the L2L tendencies and to smooth the results, filter noises, and maintain predictions close to actual metrology data. FIG. 3 illustrates this process in greater detail. As represented in FIG. 3, historical output data $Y_{historical, i}$, from the metrology tool 162 and maintained in the VM model 166 is obtained for each of i most recent wafers 300. It will be assumed for the sake of example herein that i=20, although different quantities may be used. Additionally, output data for a QC sample wafer 302 of a current lot 304 is measured using the metrology tool 162 to obtain $Y_{metrology}$. In one embodiment, an Exponentially Weighted Moving Average ("EWMA") is applied to the output data $Y_{historical, i}$, and $Y_{metrology}$, to determine a Y2Y adjustment for the wafers of the current lot 304. The following equation illustrates application of an EWMA to the historical Y data:

$$Y_{EWMA,i}=(1-\omega)*Y_{EWMA,(i-1)}+\omega*Y_{historical,i}, \text{ for } i=1\text{-}20$$

It will be noted that the initial value of $Y_{EWMA, 0}$ is equal to $Y_{EWMA, 1}$ and that ω is a weight between 0 and 1. It will be assumed for the sake of example that ω=0.5.

Then a weighted value of Y for the current lot ($Y_{EWMA\_current\_lot}$), for the current lot is calculated as follows:

$$Y_{EWMA\_current\_lot}=(1-\omega)*Y_{EWMA,20}+\omega*Y_{metrology}$$

Finally, the Y2Y adjusted output values for each of the j wafers of the current lot 404 are calculated as follows:

$$Y2Y_{adjusted,j}=(1-\omega)*Y_{EWMA\_current\_lot}+\omega*Y_{predicted,j}$$

where $Y_{predicted, j}$ is the output value predicted by the VM for wafer j.

Referring again to FIG. 2, in step 216, W2W control is performed by the module 170 in a conventional manner using the Y2Y adjusted values output from the VM model 166.

Although only a few exemplary embodiments of this invention have been described in detail above, those skilled in the art will readily appreciate that many modifications are possible in the exemplary embodiments without materially departing from the novel teachings and advantages of this invention. In particular, it is understood that the historical training data set and the historical update data set may include more or fewer than 60 and 20 data records, respectively. Moreover, it is understood that the EWMA may be performed using historical data for more or fewer than 20 wafers. Additionally, each of the FDC 154, the VM model 166, and the W2W APC controller module 170 may be implemented on separate computing devices or one or more of those elements may be implemented on a single computing device. Each such computing device may include one or more of processing capabilities, memory and/or storage capabilities, input/output capabilities, and display capabilities. The Y2Y adjustment unit 168 may be implemented as part of the VM model 166 or the module 170.

It is understood that various different combinations of the above-listed embodiments and steps can be used in various sequences or in parallel, and there is no particular step that is critical or required. Furthermore, features illustrated and discussed above with respect to some embodiments can be combined with features illustrated and discussed above with respect to other embodiments. Accordingly, all such modifications are intended to be included within the scope of this invention.

What is claimed is:

1. A virtual metrology ("VM") advanced process control ("APC") system comprising:

a process tool for processing a plurality of wafers in accordance with process inputs received thereby;

a metrology tool for measuring a feature of one or more wafers of the plurality of wafers and generating actual metrology data therefrom, wherein the one or more wafers comprises one or more quality control ("QC") sample wafers;

a VM model for predicting metrology data for each of the plurality of wafers;

an APC controller for receiving the predicted metrology data and the actual metrology data and for generating the process inputs to the process tool in accordance with the predicted and actual metrology data; and an adjustment unit configured to filter the predicted metrology data for each of the wafers from the plurality of wafers by applying an exponentially weighted moving average ("EWMA") filter to the predicted metrology data using historical EWMA metrology data and current actual EWMA metrology data, wherein the current actual EWMA metrology data is described by a model equation expressed as:

$$Y_{Current\,Actual\,EWMA}=(1-\omega)*Y_{Historical\,EWMA}+\omega*Y_{Metrology}$$

wherein ω denotes a weight factor, $Y_{Historical\,EWMA}$ denotes the historical EWMA metrology data collected from other QC sample wafers, and $Y_{Metrology}$ denotes the actual metrology data for the QC sample wafer processed by the metrology tool,
  wherein the filtered predicted metrology data for each of the wafers from the plurality of wafers is described by a model equation expressed as:

$$Y_{Filtered\ Predicted\ Metrology\ Data} = (1-\omega)*Y_{Current\ Actual\ EWMA} + \omega*Y_{Predicted\ Metrology\ Data}$$

wherein $\omega$ denotes the weight factor, $Y_{Current\ Actual\ EWMA}$ denotes the current actual EWMA metrology data, and $Y_{Predicted\ Metrology\ Data}$ denotes the predicted metrology data from the VM model for one of the wafers from the plurality of wafers; and
  wherein the actual metrology data for the QC sample wafer is used to update the VM model; and
  wherein key variables of the VM model are updated only in response to a determination that the metrology data predicted by the VM model is inaccurate; and
  wherein parameters of the VM model are updated responsive to receipt of the actual metrology data for the QC sample wafer.

2. The VM APC system of claim 1 further comprising:
  a fault detection and classification ("FDC") module for receiving and storing process data from the process tool, the process data indicative of an operation of the process tool.

3. The VM APC system of claim 2 wherein the FDC module preprocesses the received process data to time average the process data and generate FDC data and provides the FDC data to the VM model for use in updating the VM model.

4. The VM APC system of claim 1 wherein the adjustment unit filters the predicted metrology data generated by the VM model before such data is provided to the APC controller.

5. The VM APC system of claim 1 wherein the parameters include weights.

6. The VM APC system of claim 1 wherein the key variables are selected from a group consisting of temperature, etchant, pressure, flow, and process time.

7. The VM APC system of claim 1 wherein the one or more QC sample wafers comprises two QC sample wafers.

8. A method for implementing a virtual metrology ("VM") advanced process control ("APC") platform, the method comprising, for each of a plurality of process runs:
  processing a lot of wafers comprising a process run in accordance with process inputs from an APC controller;
  measuring a feature of at least one wafer of the lot of wafers, the at least one wafer comprising a quality control ("QC") sample wafer, and generating actual metrology data therefrom;
  testing an accuracy of a VM model and updating key variables of the VM model only if the VM model is determined not to be accurate;
  updating parameters of the VM model using the actual metrology data for the QC sample wafer of the current lot and historical metrology data for a plurality of QC sample wafers of previous lots;
  providing predicted metrology data for the wafers from the VM model to the APC controller for enabling the APC controller to adjust the process inputs for processing a next lot of wafers; and
  filtering the predicted metrology data for each wafer from the lot of wafers by applying an exponentially weighted moving average ("EWMA") filter to the predicted metrology data using historical EWMA metrology data and current actual EWMA metrology data, wherein the current actual EWMA metrology data is described by a model equation expressed as:

$$Y_{Current\ Actual\ EWMA} = (1-\omega)*Y_{Historical\ EWMA} + \omega*Y_{Metrology}$$

wherein $\omega$ denotes a weight factor, $Y_{Historical\ EWMA}$ denotes the historical EWMA metrology data collected from other QC sample wafers, and $Y_{Metrology}$ denotes the actual metrology data for the QC sample wafer,
  wherein the filtered predicted metrology data for each wafer from the lot of wafers is described by a model equation expressed as:

$$Y_{Filtered\ Predicted\ Metrology\ Data} = (1-\omega)*Y_{Current\ Actual\ EWMA} + \omega*Y_{Predicted\ Metrology\ Data}$$

wherein $\omega$ denotes the weight factor, $Y_{Current\ Actual\ EWMA}$ denotes the current actual EWMA metrology data, and $Y_{Predicted\ Metrology\ Data}$ denotes the predicted metrology data from the VM model for one of the wafers from the lot of wafers.

9. The method of claim 8 wherein filtering predicted metrology data generated by the VM model occurs before such data is provided to the APC controller.

10. The method of claim 8 wherein the parameters include weights.

11. The method of claim 8 wherein the key variables are selected from a group consisting of temperature, etchant, pressure, flow, and process time.

12. The method of claim 8 wherein the plurality of QC sample wafers of previous lots comprises the X most recent QC sample wafers, where X is a number greater than or equal to 20.

13. A virtual metrology ("VM") advanced process control ("APC") system comprising:
  means for processing a plurality of wafers;
  means for measuring a sample wafer of the plurality of wafers and generating actual metrology data therefrom;
  means for predicting metrology data for each of the plurality of wafers, wherein the actual metrology data is received from the measuring means and used to update a virtual metrology ("VM") model, and wherein key variables of the VM model are updated at a first frequency, and wherein parameters of the VM model are updated at a second frequency responsive to receipt of the actual metrology data for the sample wafer of the plurality of wafers, the second frequency being higher than the first frequency;
  means for receiving the predicted metrology data and the actual metrology data and controlling an operation of the process tool based on the actual and predicted metrology data; and
  means for filtering the predicted metrology data for each wafer from the plurality of wafers by applying an exponentially weighted moving average ("EWMA") filter to the predicted metrology data using historical EWMA metrology data and current actual EWMA metrology data, wherein the current actual EWMA metrology data is described by a model equation expressed as:

$$Y_{Current\ Actual\ EWMA} = (1-\omega)*Y_{Historical\ EWMA} + \omega*Y_{Metrology}$$

wherein $\omega$ denotes a weight factor, $Y_{Historical\ EWMA}$ denotes the historical EWMA metrology data collected from other sample wafers, and $Y_{Metrology}$ denotes the actual metrology data for the sample wafer,
  wherein the filtered predicted metrology data for each wafer from the plurality of wafers is described by a model equation expressed as:

$$Y_{Filtered\ Predicted\ Metrology\ Data} = \\ (1-\omega)*Y_{Current\ Actual\ EWMA} + \\ \omega*Y_{Predicted\ Metrology\ Data}$$

wherein $\omega$ denotes the weight factor, $Y_{Current\ Actual\ EWMA}$ denotes the current actual EWMA metrology data, and $Y_{Predicted\ Metrology\ Data}$ denotes the predicted metrology data from the means for predicting metrology data for one of the wafers from the plurality of wafers.

14. The VM APC system of claim 13 further comprising:

fault detection and classification ("FDC") means for receiving and storing process data from the process tool, the process data indicative of an operation of the process tool.

15. The VM APC system of claim 14 wherein the FDC means preprocesses the received process data to time average the process data and generate FDC data and provides the FDC data to the predicting means for use in updating the variables and parameters of the predicting means.

16. The VM APC system of claim 14 wherein the parameters include weights and the key variables are selected from a group consisting of temperature, etchant, pressure, flow, and process time.

17. The VM APC system of claim 13 wherein the means for filtering the predicted metrology data generated by the predicting means occurs before such data is provided to the means for controlling.

\* \* \* \* \*